US006442499B1

(12) United States Patent
Gorin

(10) Patent No.: US 6,442,499 B1
(45) Date of Patent: Aug. 27, 2002

(54) METHODS AND APPARATUS FOR STATISTICAL PROCESS CONTROL OF TEST

(75) Inventor: Jacky Gorin, Scottsdale, AZ (US)

(73) Assignee: Test Advantage, Inc., Tempe, AZ (US)

( * ) Notice: Subject to any disclaimer, the term of this patent is extended or adjusted under 35 U.S.C. 154(b) by 0 days.

(21) Appl. No.: 09/902,072

(22) Filed: Jul. 10, 2001

Related U.S. Application Data

(63) Continuation of application No. 09/821,903, filed on Mar. 29, 2001, now abandoned.
(60) Provisional application No. 60/192,834, filed on Mar. 29, 2000, provisional application No. 60/213,335, filed on Jun. 22, 2000, and provisional application No. 60/234,213, filed on Sep. 20, 2000.

(51) Int. Cl.$^7$ ................................................. G06K 5/02
(52) U.S. Cl. .................. 702/120; 702/117; 702/118; 702/119; 702/128
(58) Field of Search .......................... 702/83, 128, 146, 702/147, 179, 182, 117, 118, 119, 120; 716/18; 395/500

(56) References Cited

U.S. PATENT DOCUMENTS

| | | | | | |
|---|---|---|---|---|---|
| 4,109,511 | A | * | 8/1978 | Powers, Jr. et al. | 73/37.6 |
| 5,495,417 | A | * | 2/1996 | Fukuda et al. | 364/468 |
| 5,539,652 | A | * | 7/1996 | Tegethoff | 364/490 |
| 5,694,325 | A | * | 12/1997 | Fukuda et al. | 364/468.28 |
| 5,892,949 | A | * | 4/1999 | Noble | 395/704 |
| 5,966,527 | A | * | 10/1999 | Krivokapi et al. | 395/500.35 |
| 6,182,022 | B1 | * | 1/2001 | Mayle et al. | 702/182 |
| 6,279,146 | B1 | * | 8/2001 | Evans et al. | 716/18 |

FOREIGN PATENT DOCUMENTS

| | | |
|---|---|---|
| EP | 1067392 A2 | 6/2000 |

OTHER PUBLICATIONS

"Introduction to Integrated Yield Analysis," http://www.semiconductor.net/semiconductor/issues/issues/1999/jan99/docs/yield.asp.

"Technique Closes the Loop on Test System Uncertainty," http://www.tmworld.com/articles/05_1999_Technique_Loop.htm.

"Automatically Analyzing Effects of Process Equipment on Yield," http://www.semiconductor.net/semiconductor/issues/issues/1999/aug99/docs/yield.asp.

"Capability Ratios Vary," http://www.qualitydigest.com/june97/html/capablty.html.

"Using SPC in Batch Processes," http://www.qualitydigest.com/mar98/html/spcbatch.html.

"Splitting Wafer Lots in Semiconductor Manufacturing, Part III: Comparing Two Processes—A Better Approach," http://www.semiconductoronline.com/content/news/article.asp?DocID={66EE75EA-372B-11D4-8C3D-009027DE0829}&Bucket=Features&V.

"Technique Closes the Loop on Test System Uncertainty," http://www.tmworld.com/articles/05_1999_Technique_Loop.htm.

"How Much Measurement Error is Too Much? Part I: Modelling Measurement Data," http://www.testandmeasurement.com/content/news/article.asp?DocID={592878CF-FC4E-11D3-8C2C-009027DE0829}&Bucket=HomeFeaturedArticles.

* cited by examiner

*Primary Examiner*—Marc S. Hoff
*Assistant Examiner*—Felix Suarez
(74) *Attorney, Agent, or Firm*—Snell & Wilmer, L.L.P.

(57) ABSTRACT

Methods and apparatus for statistical process control of test according to various aspects of the present invention optimize the wait period between applying input signals and collecting output test signal data. In one embodiment, a tester identifies one or more acceptable systems, circuit boards, or components and performs testing to establish baseline test data. The systems, circuit boards, or components are then tested using a series of different waiting periods to generate wait time optimization data. The wait time optimization data and the baseline data are then statistically analyzed, for example using statistical process control techniques, to identify a wait period for which the test process is out of control. An optimized wait period is then selected that is suitable to maintain the test process under control.

19 Claims, 6 Drawing Sheets

METHODS AND APPARATUS FOR STATISTICAL PROCESS CONTROL OF TEST

CROSS-REFERENCES TO RELATED APPLICATIONS

This application is a continuation of U.S. patent application Ser. No. 09/821,903, filed on Mar. 29, 2001, now abandoned and claims the benefit of U.S. Provisional Patent Application No. 60/192,834, filed Mar. 29, 2000, U.S. Provisional Patent Application No. 60/213,335, filed Jun. 22, 2000, and U.S. Provisional Patent Application No. 60/234,213, filed Sep. 20, 2000, and incorporates the disclosure of each application by reference.

FIELD OF THE INVENTION

The invention relates to semiconductor testing, and more particularly, to optimizing test time for automatic test equipment.

BACKGROUND

Modern semiconductor products pack powerful functionality into miniscule packages. As semiconductor components become more complex, physical integrated circuits shrink, and manufacturing rates increase, the need for accurate and rapid testing of the circuits sharpens. Although testing of semiconductors, especially new products, is crucial to maintain quality control, testing slows the overall productivity of the manufacturing process and adds complexity and cost to an already very complex and expensive process.

Automatic test equipment (ATE) performs most modern testing of semiconductors during the engineering and production processes. The ATE receives a collection of components, often provided on a single wafer, as a batch of packaged integrated chip components, as a circuit board, or as a system, and automatically provides input signals to the various components and measures the components' output responses. With the ever-increasing complexity of semiconductors and other electronics products, however, ATE is increasingly complex as well. Accordingly, ATE represents a large investment that requires regular upgrading and replacement as new technology surpasses the capabilities of older ATE.

To maximize the value of an ATE, semiconductor manufacturers make every effort to improve the efficiency of the ATE while maintaining testing accuracy. Even minor improvements in the test time for each individual circuit tested may incrementally save significant sums by improving the throughput of the ATE, thus reducing the overall cost per component.

BRIEF SUMMARY OF THE INVENTION

Methods and apparatus for statistical process control of test according to various aspects of the present invention provide improved test times at run-time by optimizing the wait period between applying input signals and collecting output test signal data. In one embodiment, a tester identifies one or more acceptable systems, circuit boards, or components and performs testing to establish baseline test data. The systems, circuit boards, or components are then tested using a series of different waiting periods to generate wait time optimization data. The wait time optimization data and the baseline data are then statistically analyzed, for example using statistical process control techniques, to identify a wait period for which the test process is out of control. An optimized wait period is then selected that is suitable to maintain the test process under control.

BRIEF DESCRIPTION OF THE DRAWING

A more complete understanding of the present invention may be derived by referring to the detailed description and claims when considered in connection with the following illustrative figures. In the following figures, like reference numbers refer to similar elements and steps throughout the figures.

Elements and steps in the figures are illustrated for simplicity and clarity and have not necessarily been rendered according to any particular sequence. For example, steps that may be performed concurrently or in different order are illustrated in the figures to help to improve understanding of embodiments of the present invention.

DETAILED DESCRIPTION OF EXEMPLARY EMBODIMENTS

The present invention may be described herein in terms of functional block components and various processing steps. Such functional blocks may be realized by any number of hardware or software components configured to perform the specified functions. For example, the present invention may employ various machines, processors, and integrated circuit components, e.g., statistical engines, memory elements, signal processing elements, logic elements, look-up tables, and the like, which may carry out a variety of functions under the control of one or more testers, microprocessors, or other control devices. In addition, the present invention may be practiced in conjunction with any number of statistical processes, and the system described herein is merely one exemplary application for the invention. Further, the present invention may employ any number of conventional techniques for data analysis, component interfacing, data processing, component handling, and the like.

Figure 1:
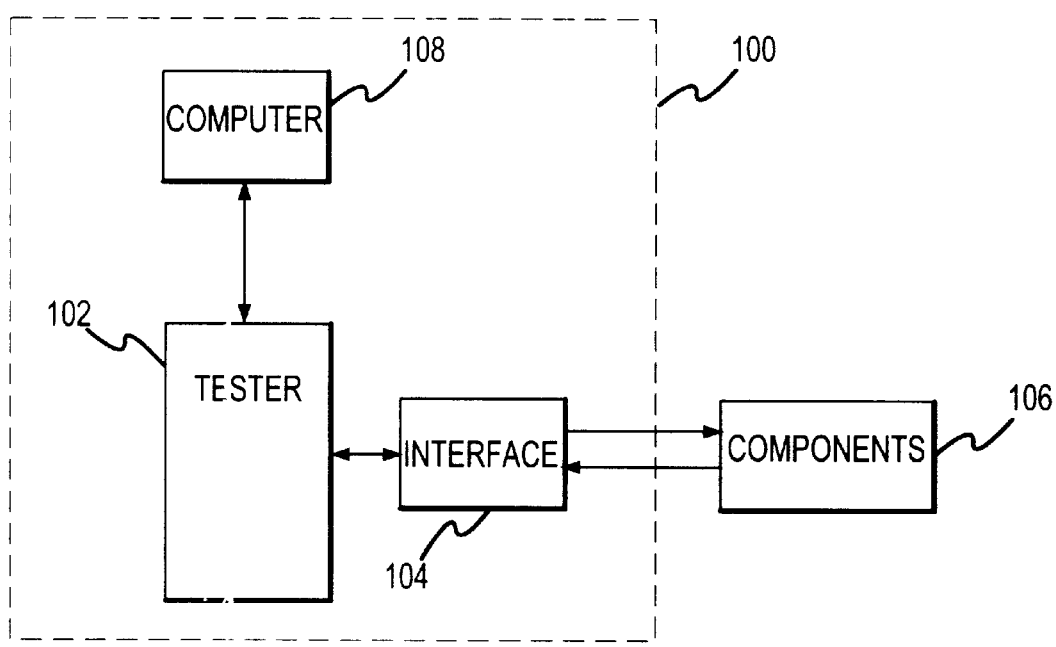
FIG. 1 is a block diagram of an exemplary testing system.

Referring to FIG. 1, a test system 100 for testing components 106 according to various aspects of the present invention operates in conjunction with a tester 102, such as ATE for testing semiconductors. The test system 100 may be configured for testing any components 106, such as semiconductor devices on a wafer, circuit boards, packaged integrated circuit chips, or other electrical or optical systems. In the present embodiment, the components 106 comprise multiple integrated circuit dies formed on a wafer and/or packaged devices. The tester 102 may comprise a conventional automatic tester, such as a Teradyne tester, and suitably operates in conjunction with other equipment for facilitating the testing. For example, the test system 100 may include a device interface 104, like a conventional device interface board and/or a device handler or prober, to handle the components 106 and provide an interface between the components 106 and the tester 102. In addition, the tester 102 may operate with a separate computer system 108 to, for example, program the tester 102, load and/or execute the test program, collect data, provide instructions to the tester 102, implement a statistical engine, or control tester parameters.

The tester 102 applies test signals to the components 106 via the device interface 104, gathers and analyzes test data, and identifies the quality of the components 106 according to the data. The tester 102 may be programmed to operate independently, or may be controlled by the computer 108. To test a component 106, the tester 102 provides various input test signals to the component 106, waits for a selected wait period, and reads the corresponding output test signals from the component 106. A single component 106 may be subjected to several different kinds of tests, and various tests may be repeated. In addition, the various tests may have different wait periods or more than one wait period associated with the test. The resulting output signals are stored and analyzed to identify potentially defective components 106.

In a test system 100 according to various aspects of the present invention, the test system 100 performs a wait period optimization process to reduce the duration of the wait period and reduce the overall test time. Alternatively, the test system 100 may analyze the performance of the system using an optimized wait period to monitor whether the process remains under control. At run time, the test system 100 may initially test one or more components 106 to establish an optimized wait period long enough to allow the output signal to stabilize but without wasting substantial additional time. By determining the optimized wait period, the overall test time for a test run of multiple components 106 may be reduced. In one embodiment, the test system 100 tends to improve efficiency without substantially increasing risk, i.e. loss of yield or passage of bad devices.

Figure 2:
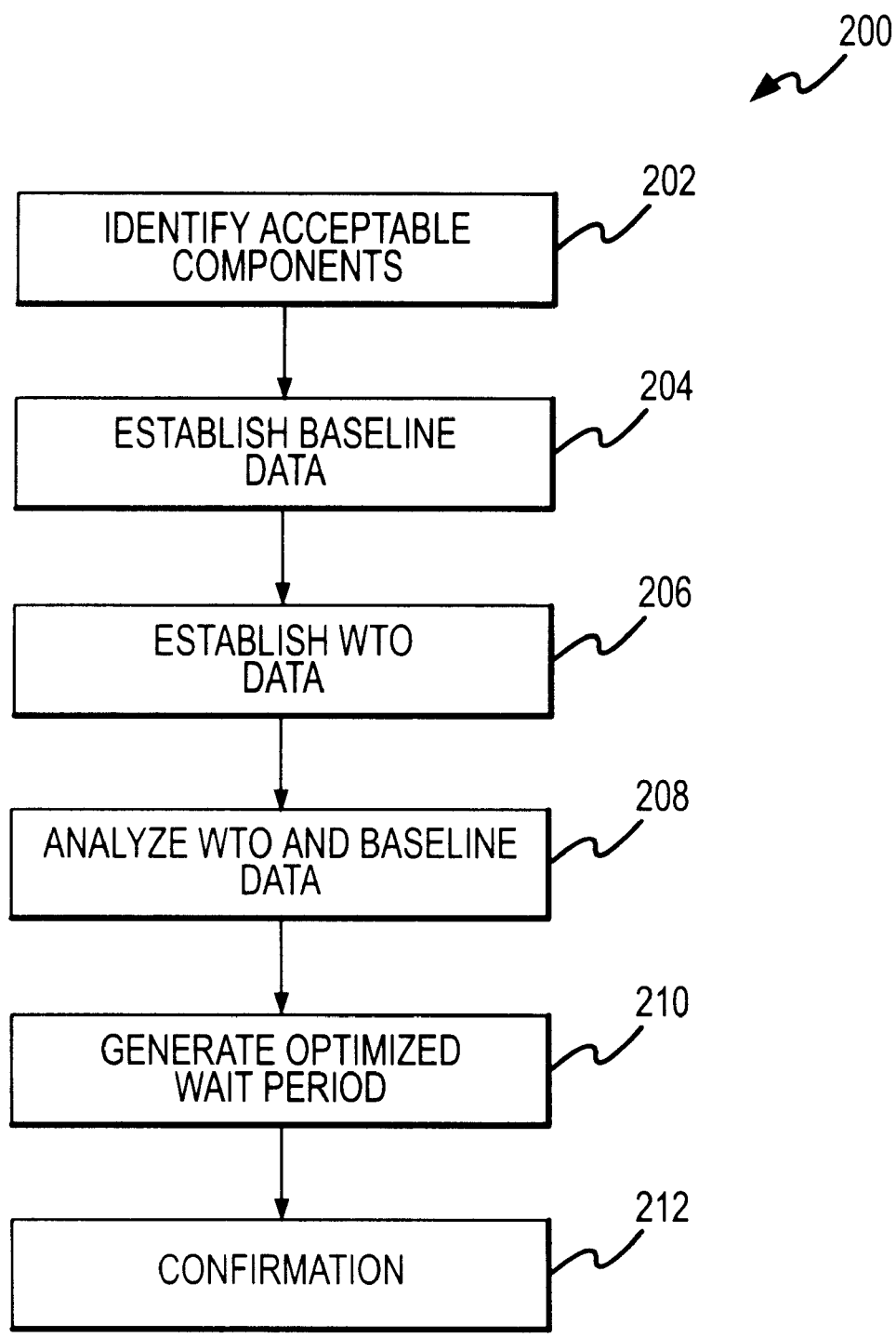
FIG. 2 illustrates a wait period optimization process.

Referring to FIG. 2, in accordance with various aspects of the present invention, the test system 100 performs a wait time optimization process 200 to reduce the overall test time per component 106. Initially, the test system 100 identifies one or more acceptable components 106 (step 202). The acceptable component 106 is tested to establish baseline data (step 204) and wait time optimization (WTO) data (step 206). The baseline data and the WTO data may then be analyzed (step 208), for example in conjunction with a statistical engine, to generate an optimized wait period (step 210). The optimized wait time may then be verified using one or more other acceptable components 106 (step 212). The wait period optimization process is suitably performed at the time of the test run so that the optimized wait period corresponds to the conditions of the test system 100 at run time.

Figure 3:
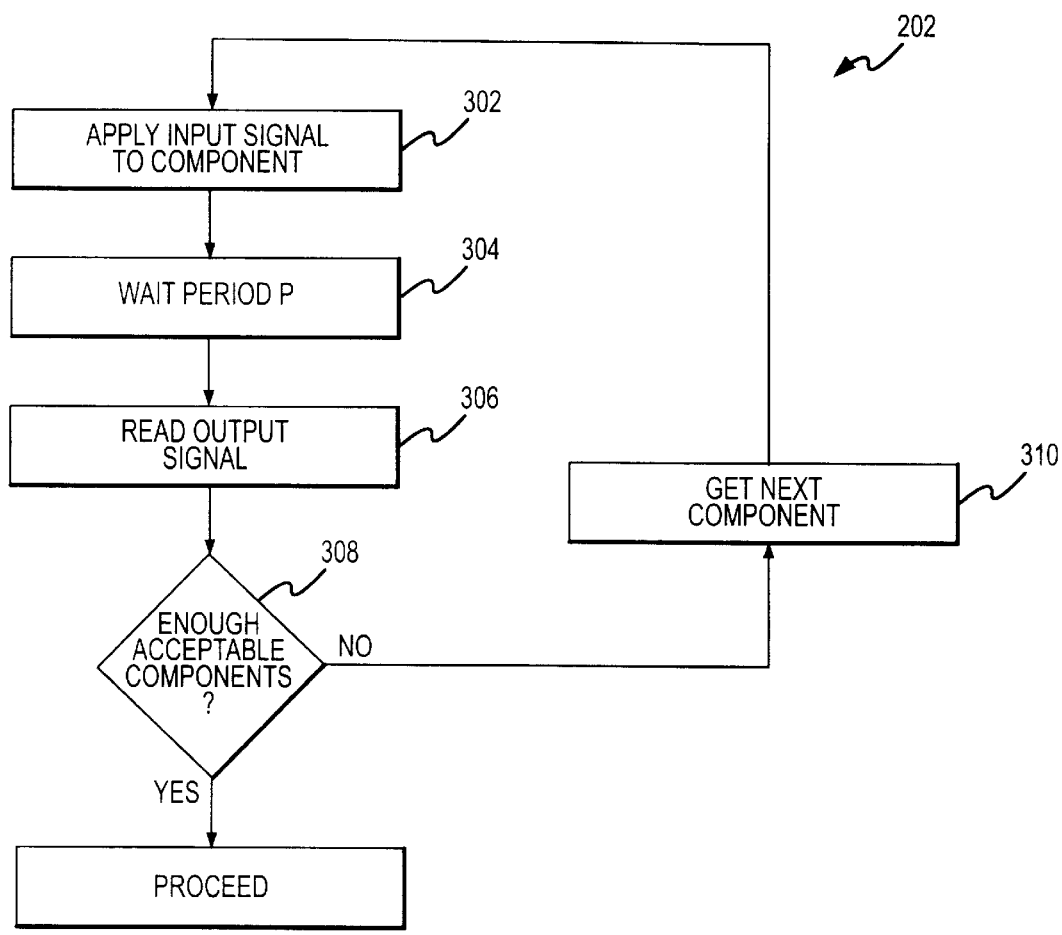
FIG. 3 illustrates a process for identifying acceptable components for wait period optimization.

Referring now to FIG. 3, to identify acceptable components, the tester 102 begins testing components 106 using an initial wait period P and a testing program. Input signals are applied to the component 106 (step 302), the tester 102 waits the initial wait period P (step 304), and then collects the output test signals from the component 106 (step 306). The initial wait period P is suitably selected, suitably according to conventional criteria, to provide adequate time for the output signal to stabilize prior to collecting the output test signals. The tester 102 continues testing components 106 (step 310) until a desired number of acceptable components 106 are identified (step 308). The number of acceptable components 106 to be identified may be any number satisfactory to confirm validity of the optimized wait period, as described below. In addition, the criteria for determining whether a component 106 is acceptable may be selected according to any suitable criteria, such as having zero defects based on a conventional testing analysis. In the present embodiment, the acceptable components 106 comprise any good devices on a wafer (often referred to as Bin 1 components for any full-specification good device using an initial wait period P). If a component 106 passes all of the relevant tests, the device is GOOD, but if one or more test fails, the component 106 is classified as BAD.

Figure 4:
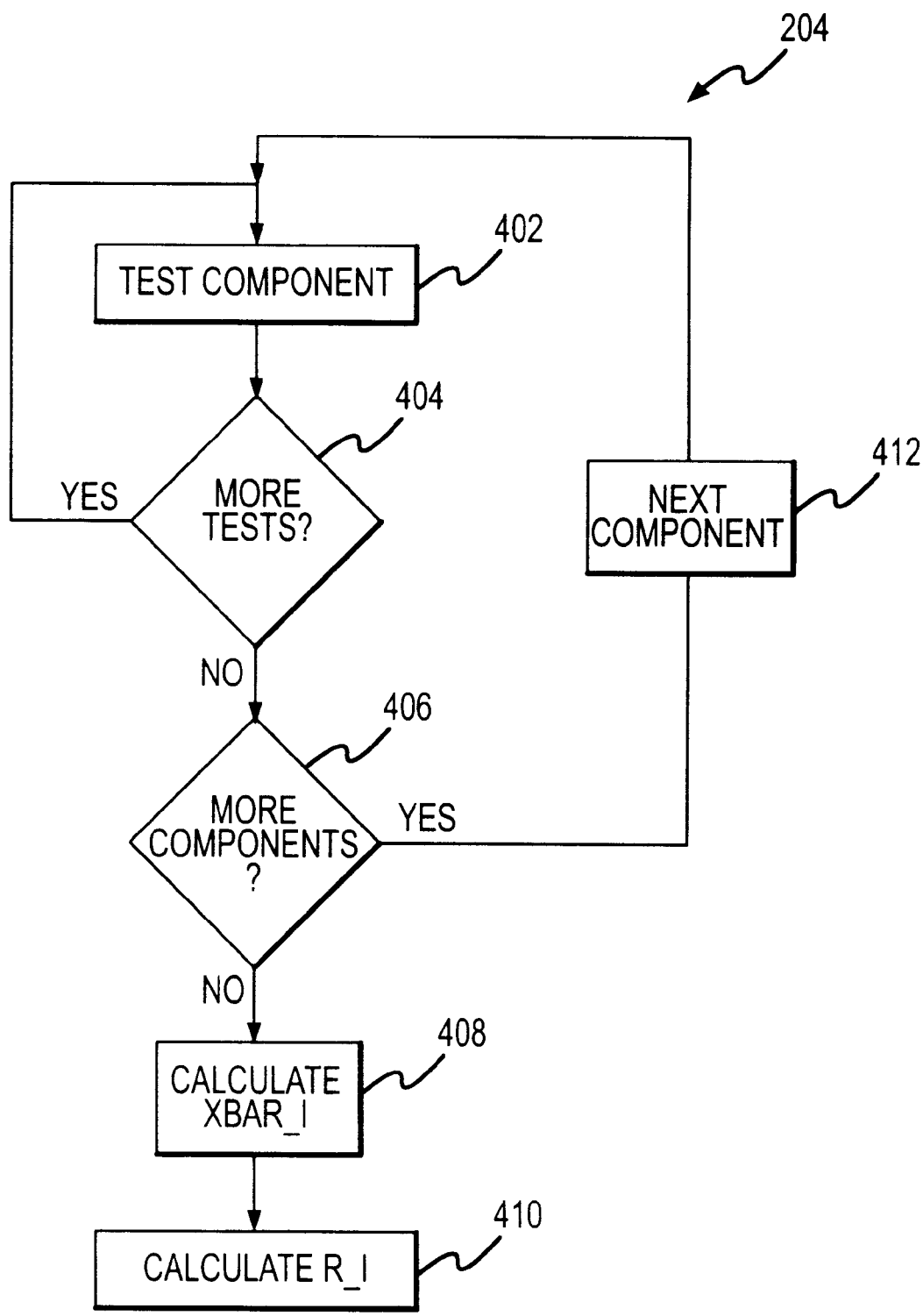
FIG. 4 illustrates a baseline data process.

Referring now to FIG. 4, after identifying at least one acceptable component 106, the tester 102 then suitably initiates the baseline test data process 204 to generate baseline output test signal data. The acceptable component 106 is tested one or more times (steps 402, 404), for example ten times in the present embodiment, using the initial wait period P, and the output test signals are collected and stored for each test. The data corresponding to the initial wait period P may then be used to determine a set of baseline data which may then be used to optimize the wait period.

For example, the test system 100 suitably implements an XBAR and R statistical analysis in conjunction with the output test signals. In the present embodiment, the test system 100 collects the data for the ten consecutive repeated tests (typically referred to as retest) of the same acceptable component 106 and applies a statistical analysis to the output test signal data to establish the baseline data. In particular, the test system 100 establishes a baseline average output signal value (step 408) and a baseline range for the acceptable component 106 (step 410). For example, the data may indicate that the average output test signal for the acceptable components in a particular test using the initial wait period is 4.0 volts (XBAR_I=4.0V), and the range of values for the output test signal is between 3.8 to 4.3 volts (R_I=0.5). Alternatively, the baseline data may be calculated using data from multiple acceptable components 106 (steps 406, 412).

Figure 5:
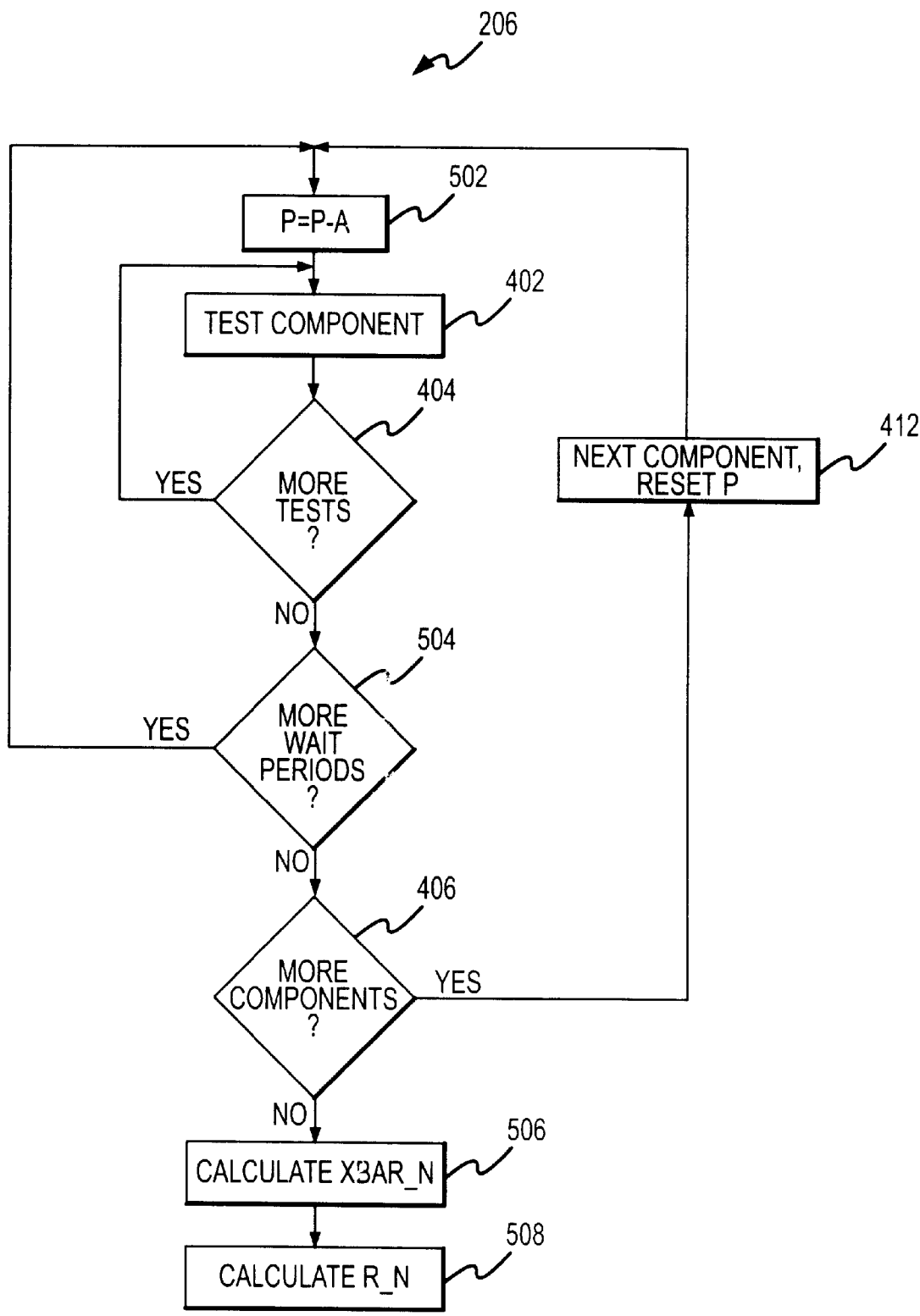
FIG. 5 illustrates a wait time optimization data process.

The test system 100 also suitably performs the WTO data process 206 to collect WTO data and identify an optimized wait period based on the WTO data and the baseline data. The test system 100 tests one of the acceptable components 106 using different candidate wait periods and collects the corresponding output test signals from the component 106. Referring to FIG. 5, in the present embodiment, the tester 102 repeatedly tests the component using a second wait period for testing (steps 402, 404) that is different than the initial wait period by a selected amount A (step 502). The second wait period may be shorter or longer that the initial wait period according to the objective and implementation of the WTO process. After the output test signal is received, the input signal is again applied to the component using a third wait period that is different than the second period by a selected amount and the output test signal is collected from the component 106.

The process of applying the input signal and collecting the output test signal following decrementally shorter wait periods may be repeated any number of times (step 504). For example, the process may be repeated a set number of times, until the wait periods are shorter than a selected threshold, or until the WTO data, comprising the output test signals and values derived from the output test signals, reach a selected threshold. The test system 100, however, may apply and collect the signals according to any appropriate scheme, such as incrementing wait periods, adjusting the amounts by which the various wait periods differ, and repeating the tests for all or selected wait periods to confirm data. In addition, the test system 100 may repeat this process multiple times on the same component, suitably following an interval to stabilize the operating temperature, or apply the process to multiple acceptable components (step 406, 412). In the present embodiment, the WTO data process 206 is repeated five times for each component 106 to establish an array of data points for each candidate wait period.

The WTO data may then be used to establish WTO values for the tester under the particular run-time conditions. In the present embodiment, the WTO data is analyzed using the statistical engine to generate data to be used in the XBAR and R analysis. For example, for each candidate wait period, the test system 100 generates an average output test signal value (XBAR_N) and a range value (R_N) (steps 506, 508).

In the present embodiment, the WTO data is analyzed to identify an optimized wait period based on the baseline data and the WTO data. For example, the test system 100 may calculate a normalized WTO ratio (XBAR) of the difference between the baseline average and the WTO average to the baseline range:

$$XBAR=(XBAR\_N-XBAR\_I)/R\_I$$

The test system 100 may also calculate a range ratio (R) of the WTO range to the baseline range:

$$R=R\_N/R\_I$$

The test system 100 suitably identifies an optimized wait period using the XBAR and R values. In the present embodiment, the test system 100 compares the XBAR and R values to selected control limits to identify a candidate wait period for which the process is out of control. For example, suitable control limits for merged data in the present embodiment may be characterized as:

$$XBAR<+/-0.223$$

$$0.348<R<1.652$$

for initially establishing an optimized wait period. These control limits may be adjusted according to the particular process, implementation, and the like. Further, the control limits may be adjusted according to the current objective. For example, wider control limits may be applicable for monitoring an already optimized process taking fewer samples. In particular, the control limits may selected in accordance with a conventional analysis, such as described in ASTM publication STP-15D, *Manual on the Presentation of Data and Control Chart Analysis,* 1976.

If the XBAR and R values are within the control limits, the corresponding wait period is designated as ACCEPTABLE, and the process is under control for the corresponding candidate wait period. Conversely, if either the XBAR or the R value is outside the relevant control limits, the process is out of control for the corresponding wait period and is designated as INACCURATE. The test system 100 may analyze the candidate wait periods to identify a longest wait period for which the process is out of control. The test system 100 then suitably uses a longer wait period, such as the next longest candidate wait period, as the optimized wait period for analysis of the remaining components 106.

The test system 100 may apply any appropriate analyses of the baseline data and WTO data to establish the optimized wait period, including conventional statistical process control criteria used in an XBAR and R analysis. To reduce errors due to noisy measurements, additional analyses may be applied. For example, if more than a selected number, such as seven, WTO output test signals trend in the same direction, such as continuously decreasing as the wait periods become shorter or longer, then the process is terminated and a particular wait period, such as the initial wait period, is designated as the optimized wait period. In the present embodiment, the third candidate wait period from the beginning of the trend is designated as the optimized wait period.

The WTO data may be analyzed in any manner and at any appropriate time. For example, the WTO data may accumulate and be processed for wait period optimization after testing for a series of candidate wait periods. Alternatively, the data may be processed as it is received for immediate analysis and optimization of the wait period. In the present embodiment, the test system 100 analyzes the output test signal data as it is collected and stops the WTO data process 206 when an optimized wait period is identified.

Any suitable criteria may be utilized to identify the optimized wait period. For example, the output test signals may be analyzed to identify a threshold wait period for which the output test signals decrease below a threshold. The optimized wait period may then be selected based on the threshold wait period, such as by adding a selected duration, typically a few fractions of a second, to the threshold wait period. If no optimized wait period can be established, the WTO process may be disabled and testing proceeds using a standard test program, i.e. in conjunction with a conventional wait period, such as the initial wait period. Similarly, if the wait time optimization is not significant, the WTO process likewise may be disabled.

Following identification of the optimized wait period, the entire optimization process 200 or the WTO data process may be repeated on further acceptable components 106 one or more times to generate additional optimized wait period data and/or confirm the accuracy of the wait time optimization. Using multiple data points, the optimized wait period may be confirmed, for example by averaging the wait period data, selecting the longest or second-longest wait period, or another appropriate analysis.

Figure 6:
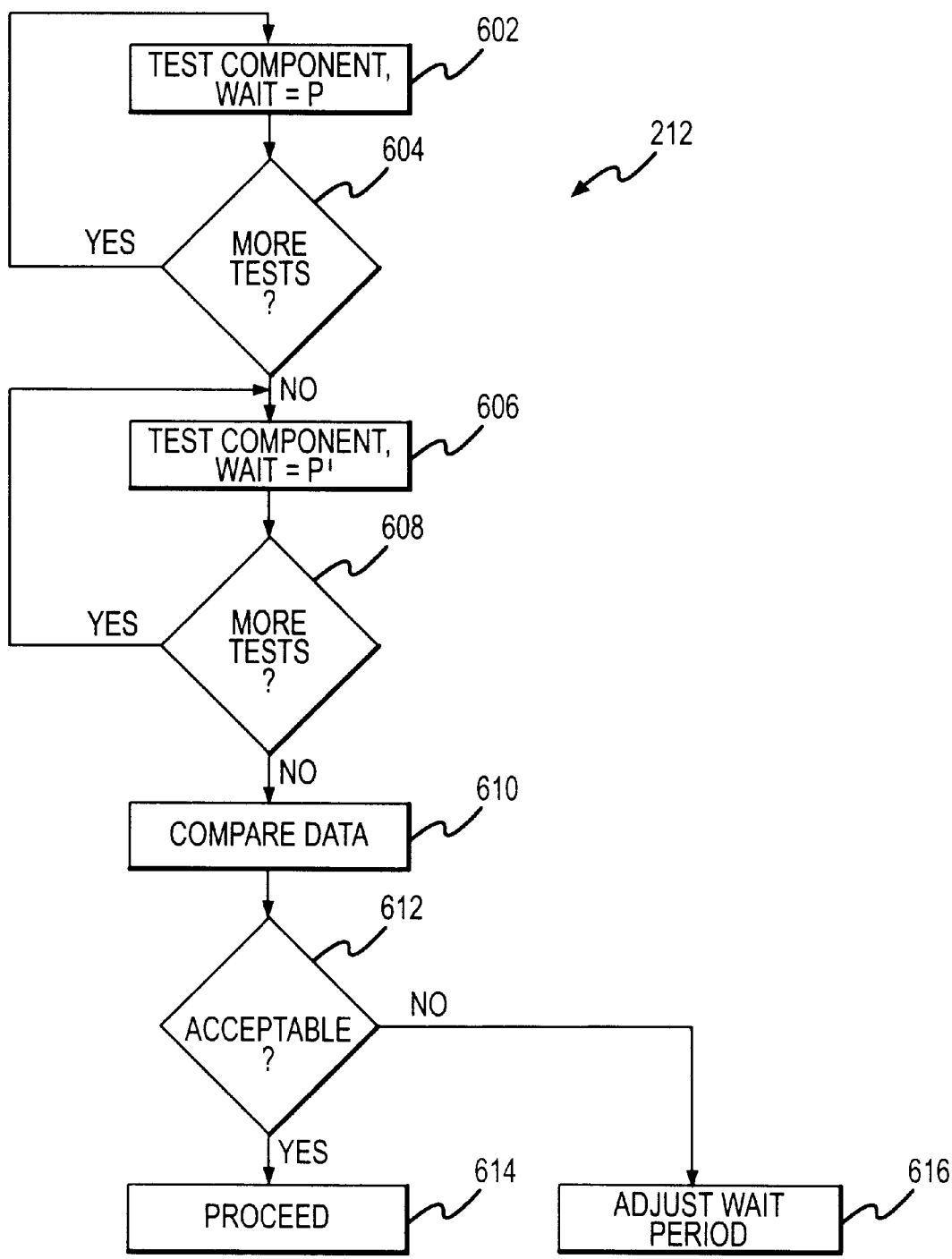
FIG. 6 illustrates an optimized wait period confirmation process.

In the present embodiment, the test system 100 uses the confirmation process 212 to verify the accuracy of the optimized wait period. For example, referring to FIG. 6, the test system 100 suitably tests at least one of the acceptable components 106 (step 602) a selected number of times (604), such as three, using the initial wait period P. The test system 100 then tests the same component(s) (step 606) a selected number of times (step 608), such as three, using the optimized wait period P. The resulting data from the initial wait period and the optimized wait period are then compared (step 610) in any appropriate manner to determine whether the test process is under control using the optimized wait period (step 612). For example, the test system 100 may use the XBAR and R process described above. If the resulting values are within preselected ranges, the testing proceeds using the optimized wait period (step 614). If not, the wait period may be increased, the optimization process 200 may be repeated to calculate a new optimized wait period, or the optimization process 200 may be disabled altogether (step 616).

The selected optimized wait period may then be applied to testing of the remaining components, for example the components of the wafer, lot, test run or the like. The wait period may be reoptimized according to the present embodiment in conjunction with any suitable criteria, such as the likelihood of variations in the environment, component characteristics, introduction of a new lot of wafers or batch of components, test equipment, engineering requirements or production requirements, or any other circumstances that may affect the accuracy of the optimized wait period.

The methods and apparatus according to various aspects of the present invention incorporate statistical process control to provide improved testing at run-time by optimizing the wait period between applying input signals and collecting output test signal data. In one embodiment, the test system uses statistical analysis, such as the XBAR and R analysis, that does not compare the test results to arbitrary or subjective control limits. Instead, the control limits are based on or influenced by the parametric data or the characteristics of the test system 100, such as the presence of noise or the number of samples taken. Accordingly, the wait time may be optimized.

It should be appreciated that the particular implementations shown and described herein are illustrative of the invention and its best mode and are not intended to otherwise limit the scope of the present invention in any way. Indeed, for the sake of brevity, conventional signal processing, data transmission, and other functional aspects of the systems (and components of the individual operating components of the systems) may not be described in detail herein. Furthermore, the connecting lines shown in the various figures contained herein are intended to represent exemplary functional relationships and/or physical couplings between the various elements. Many alternative or additional functional relationships or physical connections may be present in a practical test system.

The present invention has been described above with reference to a preferred embodiment. However, changes and modifications may be made to the preferred embodiment without departing from the scope of the present invention. These and other changes or modifications are intended to be included within the scope of the present invention, as expressed in the following claims.

What is claimed is:

1. A method of testing a component, comprising the steps of:

testing the component using an initial wait period to generate a baseline datum;

testing the component using a candidate wait period to generate a wait time optimization (WTO) datum;

comparing the baseline datum and the WTO datum to a control limit to determine whether the test is out of control, wherein the control limit is based on at least one of the baseline datum and the WTO datum; and selecting an optimized wait period according to whether the test is out of control.

2. A method according to claim 1, further comprising the step of determining whether the component is acceptable.

3. A method according to claim 1, wherein the step of comparing the baseline datum and the WTO datum to the control limit includes performing an XBAR and R analysis on the baseline datum and the WTO datum.

4. A method according to claim 1, wherein the step of comparing the baseline datum and the WTO datum to the control limit includes selecting the control limit according to a sample size of at least one of the baseline datum and the WTO datum.

5. A method according to claim 1, further comprising the step of generating a statistical value based on the WTO datum and the baseline datum, and wherein the step of comparing the baseline datum and the WTO datum to the control limit comprises comparing the statistical value to the control limit.

6. A method according to claim 1, wherein the step of comparing the baseline datum and the WTO datum to the control limit comprises the steps of:

generating a baseline average based on the baseline datum;

generating a WTO average based on the WTO datum;

determining a difference between the baseline average and the WTO average; and comparing the difference to the control limit.

7. A method according to claim 1, wherein the step of comparing the baseline datum and the WTO datum to the control limit further comprises the steps of:

generating a baseline range based on the baseline datum;

generating a WTO range based on the WTO datum;

determining a range ratio of the WTO range to the baseline range; and comparing the range ratio to a second control limit.

8. A method according to claim 1, wherein the step of comparing the baseline datum and the WTO datum to the control limit further comprises the step of determining a normalized WTO ratio of the difference between the baseline average and the WTO average to the baseline range.

9. A method of testing a plurality of components, comprising the steps of:

identifying an acceptable component from the plurality of components;

applying a plurality of tests to the acceptable component using an initial wait period to generate a plurality of baseline data;

applying a plurality of tests to the acceptable component using a candidate wait period to generate a plurality of wait time optimization (WTO) data;

generating a statistical value based on the WTO data and the baseline data;

comparing the statistical value to a control limit to determine whether the tests using the candidate wait period are under control, wherein the control limit is determined according to at least one of the baseline data and the WTO data; and selecting an optimized wait period according to whether the tests using the candidate wait period are under control.

10. A method according to claim 1, wherein the step of generating the statistical value includes performing an XBAR and R analysis on the baseline data and the WTO data.

11. A method according to claim 1, wherein the step of comparing the statistical value to the control limit includes selecting the control limit according to a sample size of at least one of the baseline data and the WTO data.

12. A method according to claim 1, wherein the step of generating the statistical value comprises the steps of:

generating a baseline average based on the baseline data;

generating a WTO average based on the WTO data; and determining a difference between the baseline average and the WTO average.

13. A method according to claim 12, wherein the step of generating the statistical value further comprises the steps of:

generating a baseline range based on the baseline data;

generating a WTO range based on the WTO data; and determining a range ratio of the WTO range to the baseline range.

14. A test system for testing a plurality of components comprising a tester, wherein the test system is configured to automatically:

apply a plurality of tests to a component using an initial wait period to generate a plurality of baseline data;

apply a plurality of tests to the component using a candidate wait period to generate a plurality of wait time optimization (WTO) data;

generate a statistical value based on the WTO data and the baseline data;

compare the statistical value to a control limit to determine whether the tests using the candidate wait period are under control, wherein the control limit is determined according to at least one of the baseline data and the WTO data;

select an optimized wait period according to whether the tests using the candidate wait period are under control; and test the remaining components using the optimized wait period.

15. A test system according to claim 1, wherein the test system is further configured to automatically determine whether the component is acceptable.

16. A test system according to claim 1, wherein the test system is further configured to automatically perform an XBAR and R analysis on the baseline data and the WTO data.

17. A test system according to claim 1, wherein the test system is further configured to automatically select the control limit according to a sample size of at least one of the baseline data and the WTO data.

18. A test system according to claim 1, wherein the test system is further configured to automatically:

generate a baseline average based on the baseline data;

generating a WTO average based on the WTO data; and determining a difference between the baseline average and the WTO average.

19. A test system according to claim 18, wherein the test system is further configured to automatically:

generate a baseline range based on the baseline data;

generate a WTO range based on the WTO data; and determining a range ratio of the WTO range to the baseline range.

* * * * *